(12) United States Patent
Alam et al.

(10) Patent No.: US 9,907,190 B1
(45) Date of Patent: Feb. 27, 2018

(54) COMPOSITE STRUCTURES AND METHODS OF MAKING

(71) Applicant: Amazon Technologies, Inc., Seattle, WA (US)

(72) Inventors: Mohammed Aftab Alam, San Jose, CA (US); David Eric Peters, San Jose, CA (US); Ramez Nachman, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 110 days.

(21) Appl. No.: 14/613,023

(22) Filed: Feb. 3, 2015

(51) Int. Cl.
| | |
|---|---|
| *G06F 1/16* | (2006.01) |
| *H05K 5/00* | (2006.01) |
| *C25D 5/54* | (2006.01) |
| *C23C 30/00* | (2006.01) |

(52) U.S. Cl.
CPC ........... *H05K 5/0004* (2013.01); *C23C 30/00* (2013.01); *C25D 5/54* (2013.01)

(58) Field of Classification Search
CPC ................ G06F 1/1626; G06F 1/1633; G06F 2200/1633; G06F 2200/1634; H04M 1/0202; H04M 1/026; H04M 1/0266; H04M 1/0277; B29C 33/40; B29C 33/405; B29C 33/56

See application file for complete search history.

(56) References Cited

U.S. PATENT DOCUMENTS

| | | | | |
|---|---|---|---|---|
| 5,049,085 | A * | 9/1991 | Reylek | H01R 43/00 439/591 |
| 5,744,214 | A * | 4/1998 | Berasi | C23C 14/042 428/137 |
| 6,111,760 | A * | 8/2000 | Nixon | H04B 1/3833 220/4.02 |
| 6,326,555 | B1 * | 12/2001 | McCormack | H05K 3/462 174/255 |
| 6,771,237 | B1 * | 8/2004 | Kalt | G02B 26/02 345/31 |
| 6,879,298 | B1 * | 4/2005 | Zarro | H01Q 5/47 343/756 |
| 8,541,687 | B2 * | 9/2013 | Markovich | H05K 3/462 174/251 |
| 8,873,226 | B1 * | 10/2014 | Peters | G06F 1/1613 361/679.01 |
| 8,962,132 | B2 * | 2/2015 | Liu | C25B 13/02 252/500 |
| 8,994,662 | B2 * | 3/2015 | Nakamura | G06F 3/02 345/168 |
| 9,468,118 | B1 * | 10/2016 | Peters | H05K 5/04 |
| 2003/0007330 | A1 * | 1/2003 | Kondo | H05K 3/4617 361/748 |

(Continued)

*Primary Examiner* — Anthony Q Edwards
(74) *Attorney, Agent, or Firm* — Lee & Hayes, PLLC

(57) ABSTRACT

This disclosure describes composite structures and method of making the structures. The structures according to this disclosure may be used in handheld electronics. In example embodiments, holes are formed through a planar polymeric core. A metallic coating is disposed on the core to coat external surfaces of the core as well as internal surfaces of the holes. The metallic coating may entirely occlude the holes. The resulting structure may provide improved strength and rigidity and resist delamination of the metallic coating.

20 Claims, 6 Drawing Sheets

(56) References Cited

U.S. PATENT DOCUMENTS

| | | | |
|---|---|---|---|
| 2003/0161093 A1* | 8/2003 | Lam | G06F 1/1616 361/679.24 |
| 2005/0121768 A1* | 6/2005 | Edelstein | H01L 21/486 257/698 |
| 2006/0055500 A1* | 3/2006 | Burke | H01C 1/028 338/22 R |
| 2007/0160808 A1* | 7/2007 | Okuda | H01R 13/2414 428/137 |
| 2009/0040790 A1* | 2/2009 | Payne | G06F 1/1616 362/632 |
| 2010/0143778 A1* | 6/2010 | Huang | H01M 2/1061 429/100 |
| 2010/0271767 A1* | 10/2010 | Weber | C25D 11/16 361/679.02 |
| 2011/0024350 A1* | 2/2011 | Entezarian | B22D 17/22 210/510.1 |
| 2011/0262693 A1* | 10/2011 | Mittelsteadt | B01D 69/10 428/117 |
| 2011/0262698 A1* | 10/2011 | Lerner | H01H 13/704 428/137 |
| 2013/0329173 A1* | 12/2013 | Jung | H04B 1/3838 349/122 |
| 2014/0126172 A1* | 5/2014 | Fahlgren | H01Q 1/243 361/814 |
| 2015/0004358 A1* | 1/2015 | Jung | B29C 43/021 428/131 |

* cited by examiner

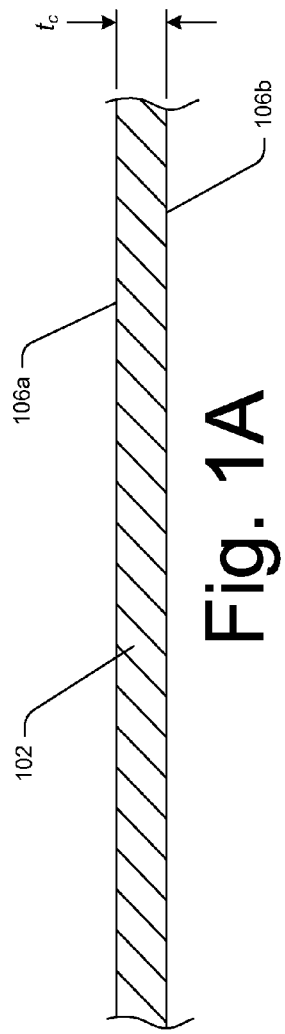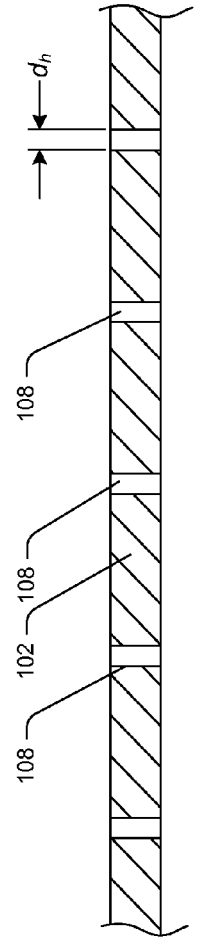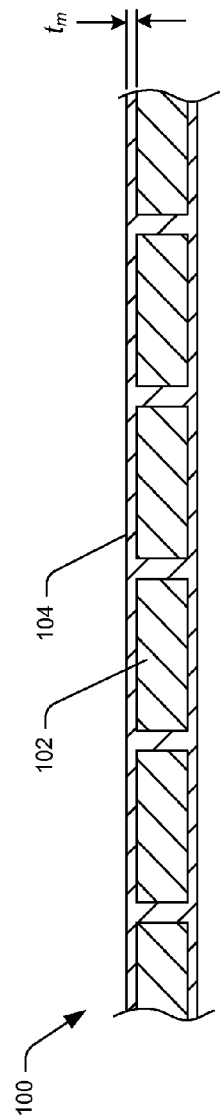

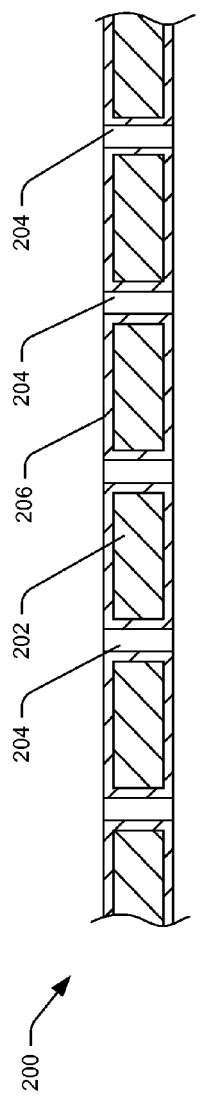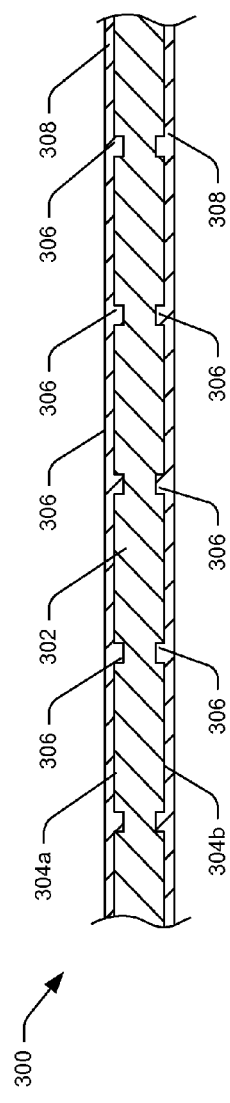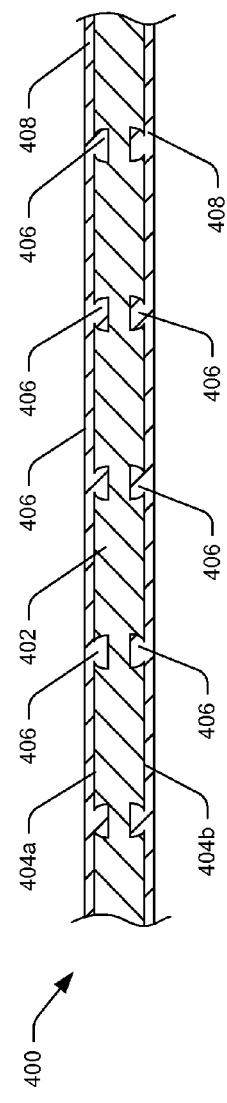

COMPOSITE STRUCTURES AND METHODS OF MAKING

BACKGROUND

Many devices, including handheld electronic devices such as phones and tablets, must be manufactured to withstand rigorous use and handling. In addition to being strong and damage resistant, it is also desirable that the weight of such devices is minimized where possible. Some conventional applications use a composite, laminate material that includes a polymer substrate laminated on opposite sides with a metallic substrate. Such a sandwich structure weighs less than an all metallic substrate of the same thickness, but is stronger and more rigid than a polymer-only substrate. However, the conventional laminate structure just described has several drawbacks. Most notably, the metallic substrate may readily delaminate from the polymer substrate. This is especially persistent in instances in which the structure is subjected to bending forces.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

FIGS. 1A, 1B, and 1C are example schematic partial cross-sectional illustrations of a structure according to embodiments of this disclosure, at three stages of manufacture.

FIG. 2 illustrates an example schematic cross-section of an alternative structure according to embodiments of this disclosure.

FIG. 3 illustrates an example schematic cross-section of another alternative structure according to embodiments of this disclosure.

FIG. 4 illustrates yet another example schematic cross-section of an alternative structure according to embodiments of this disclosure.

DETAILED DESCRIPTION

Figure 5:
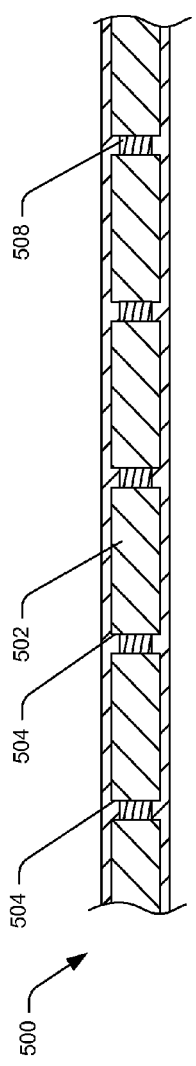
FIG. 5 illustrates still another example schematic cross-section of an alternative structure according to embodiments of this disclosure.

This disclosure describes, in part, a composite structure. The structure may be used in the manufacture and fabrication of electronic devices, such as handheld electronic devices that may be used to render content. This disclosure also describes techniques for manufacturing such structures.

In example embodiments, the structure may include a polymer core having a plurality of holes disposed therein. A metallic coating may be provided on the core, to coat at least a portion of the core and an inner surface of the holes. In some embodiments, the core may be completely encapsulated within the metallic coating. Moreover, the coating may be applied such that the holes are imperceptible after coating.

The composite structures described herein may be used in any of a number of different applications, but as mentioned above, one contemplated use is in electronic devices, such as hand held electronic devices. The structures may be suited for use as components of a housing and/or as a support member in an electronic device, for example. The composite structures may be lightweight, while still maintaining structural rigidity and having the outward appearance of metal. Unlike in conventional laminate structures, the metallic coating extends into the holes, which may help alleviate the delamination that plagues some conventional laminate-type materials.

In some embodiments, the holes in the polymer core are through-holes. When the metallic coating is applied to the polymer core having the through-holes, the metallic coating may also coat the entire inner surface of the holes. As a result, the metallic coating may be a continuous coating on external surfaces of the polymer and extending through the holes. The extensions through the holes may function like rivets through the polymer core, mechanically connecting the coating on opposite sides. In other examples, the metallic coating may extend only partially through the through holes (e.g., less than all the way).

In some embodiments, a thickness of the coating may be sufficient to completely fill the holes formed in the polymer core. The existence of the holes may be imperceptible from an exterior of the component in such embodiments. Alternatively, the thickness of the coating may be less than a radius of the holes formed in the polymer core. In some such examples, the hole may be perceptible, or even remain, but the inner surface of the hole may be completely coated with the metallic coating. When the holes formed in the core are through holes and the metallic coating has a substantially constant thickness, the resulting structure may appear to be completely metallic, with through holes formed therein. In other embodiments, in which the holes are blind holes, instead of through holes, the result may be a dimpled appearance to the surface in which the holes are formed.

In an example process, the polymer core is formed, for example, by molding, e.g., injection molding or compression molding, or by thermoforming. The process also includes forming holes in the polymer core. In some embodiments, the holes may be formed using a laser, a water jet, an air jet, a punch, or other mechanical device. Alternatively, the holes may be formed using a chemical process, such as wet etching. In still other embodiments, the holes may be formed during the process of formation of the polymer core. For example, the holes may result from a molding or thermoforming process. The process then includes applying a metallic coating to the polymer core having holes. The application may include electroplating the polymer core. In other embodiments, the metallic coating may be applied via a deposition, e.g., sputtering, process.

Accordingly, example methods and devices of the present disclosure provide a composite structure that may have increased structural integrity, improved strength and rigidity, and/or reduced weight. Example embodiments of the present disclosure will now be described with reference to the figures.

FIGS. 1A, 1B, and 1C are cross-sectional diagrams illustrating an example composite structure 100 of the present disclosure in three example operations of fabricating the structure 100. The structure 100 generally includes a core 102 and a metallic coating 104 disposed on the core 102.

As illustrated in FIG. 1A, the core 102 may be a generally planar structure, having a top surface 106a and an opposite bottom surface 106b. The distance between the top surface 106a and the bottom surface 106b is generally a thickness, $t_c$, of the core 102. In the illustrations, the top surface 106a and the bottom surface 106b are substantially parallel, such that the core 102 has a substantially constant thickness. In other embodiments, for example when the core is not generally planar, the thickness may vary along the core. In some embodiments, the thickness $t_c$ may be from about 600 to about 1000 microns.

The core 102 may be a polymer core. The polymer core may be made from any number of known polymers, including thermosets or thermopolymers. For example, the core may be formed from acrylonitrile butadiene styrene (ABS) or polycarbonate. In some implementations, the core 102 may be formed from a porous material. For example, foam, e.g., foamed polystyrene, may be used. In still other implementations, the core may be other than a polymer. For example, cellulose-based materials, e.g., paper-based materials may be used. Honeycomb structure known in the art may also be used as the core.

In FIG. 1B, a plurality of holes 108 are illustrated as formed through the core 102. In this embodiment, the holes 108 are through-holes, extending from the top surface 106a to the bottom surface 106b. The holes 108 may be formed by a mechanical process, such as drilling or punching, or by a chemical process, such as wet etching. In still other embodiments, the holes may be formed with the core, e.g., during molding of the core 102. In the Figures, the holes 108 generally are illustrated as round holes, having a diameter $d_h$. The holes need not be round, however. Other shapes, including oval, square and/or rectangular, are contemplated. In some implementations, the holes may be slots or other shaped cutouts.

The holes 108 are formed at several locations in the core 102. In FIG. 1B, the holes are illustrated as being equally spaced along a line, but equal spacing and linearity may not be required. In other examples, the holes may be non-uniformly spaced, random, localized in certain areas, or the like. As will be described in detail below with reference to FIG. 2, the holes may arranged in any array through the core 102. In some embodiments, the holes are formed in an array in the plane of the top surface 106a and/or the bottom surface 106b, e.g., normal to the thickness of the core 102. Moreover, although the holes are illustrated as being formed substantially normal to the top surface 106a and the bottom surface 106b, an axis of the holes may be other than normal to these surfaces.

In FIG. 1C, the core 102 with holes 108 formed therethrough is coated with the metallic coating 104 to form the composite structure 100. As illustrated in FIG. 1C, the metallic coating coats both the top surface 106a and the bottom surface 106b, as well as an internal surface of the holes 108, to encapsulate the polymer core 102. Although peripheral edges of the structure 100 are not shown, the coating may optionally be applied to such edges. In the embodiment illustrated in FIG. 1C, the coating is applied to the core 102 to a thickness $t_m$. The thickness $t_m$, which may vary depending upon the application technique, design specifications, and/or other criteria, may be from about 10 microns to about 30 microns in some embodiments. Moreover, although the metallic coating is shown to have a substantially uniform thickness, i.e., in some examples, the thickness may be non-uniform.

Also in FIG. 1C, the thickness of the metallic coating 104 is greater than half the hole diameter $d_h$. Accordingly, the metallic coating 104 completely occludes and fills the holes 108. In this embodiment, the metallic coating 104 is a continuous coating in that the coating on the top surface 106a of the core is mechanically connected to the coating on the bottom surface 106b of the core 102 by the coating in the holes 108. The coating in the holes 108 may act as posts or rivets, which may help to retain the metallic coating 104 on the polymer core 102.

The metallic coating 104 may be any metal or combination of metals. For example, the metallic coating may include one or more of nickel, cobalt, copper, chromium, titanium, tin, gold, palladium, and platinum. The metallic coating 108 may be applied to the core using any number of techniques. In one example, the coating is applied by electroplating. In other embodiments, the coating may be deposited on the polymer core, such by sputtering, chemical bath deposition (CBD), or physical vapor deposition (PVD), for example.

In the embodiment of FIGS. 1A-1C, the structure 100 has the outward appearance of metal, but unlike an all metal structure, the polymer core serves to reduce the overall weight of the structure 100. The metallic coating provides strength and rigidity to the polymer core. Moreover, as noted above, by applying the coating on internal surfaces of through holes, as in FIG. 1C, the metallic coating may resist delamination because the coating on the top surface 106a is connected to the coating on the bottom surface 106b.

Modifications to the structure 100 also are contemplated. For example, FIG. 2 shows a cross-sectional view of a composite structure 200. Similar to the embodiment illustrated in FIGS. 1A-1C, the composite structure 200 includes a core 202, which may be a polymer core, having a plurality of holes 204 formed therethrough. Also like the previously-described embodiments, a metallic coating 206 is applied to the core 202. In FIG. 3, however, the holes 206 are of sufficient diameter that the metallic coating does not occlude the holes 204. Accordingly, a plurality of holes remain formed through the composite structure 200 after the metallic coating is applied. In this embodiment, metallic coating on the inner surfaces of the holes may still act like a rivet connecting the coating on the top surface of the core with the coating on the bottom surface of the core, but those rivets are hollow.

The structure 200 may be used to provide a unique aesthetic over a continuous planar structure, such as the structure 100. In some embodiments, the structure 200 may also provide additional functionality. For instance, the holes 204 may act as vias in some applications, allowing for physical communication on opposite sides of the structure 200. For example, the holes could be useful when the structure is used in speaker grills, microphone heads, or the like. In some implementations, the structure 200 may be used inside a device, and wires or other electrical leads may be threaded through the holes 204. An epoxy or the like may also be disposed in the holes to retain the wires in place. As will also be appreciated, the structure 200 will be lighter weight than the structure 100 when the same structures are used for the core and the metallic coating, i.e., because of the holes.

In still other embodiments, some or all of the holes may be filled after the metallic coating is applied. For example, it may be desirable to fill the holes with a cheaper and/or lighter material. Other criteria may also or alternatively be used to select the material used to the fill the holes.

FIG. 3 illustrates another composite structure 300 according to another embodiment of this disclosure. In FIG. 3, a polymer core 302 has a plurality of holes 306 formed on each of a top surface 304a and a bottom surface 304b. A metallic coating 308 is applied to both the top surface 304a and the bottom surface 304b. In some implementations the metallic coating 308 may be the same on both the top surface and the bottom surface, or a different metallic coating could be used on each.

Because the holes 306 are not through holes, the metallic coating does not extend all the way through the thickness of the core. However, the depth of the holes may provide sufficient anchoring of the metallic coating. Although the holes 306 are illustrated as uniformly spaced, they may have different spacing, as discussed above in connection with other embodiments. Moreover, although the holes 306 in the top surface 304a and the holes 306 in the bottom surface 304b are illustrated as being substantially co-axial, they may be offset relative to each other. More or fewer holes may also be provided on the top surface 304a than on the bottom surface 304b. In some examples, the holes 306 on one of the top surface 304a or the bottom surface 304b may be denser than on the other surface. Such a construction may resist bending or flexing in one or more directions, or provide greater strength in certain portion of the structure. The holes may also have different diameters and/or take alternate shapes, and in some instances, the holes 306 may be ridges or the like extending partially or entirely across the top surface 304a or the bottom surface 304b of the core 302. For example, the holes may be formed as ridges that could extend across the entire width of the core 302 or along the entire length of the core 302.

Modifications to the structure 300 may also provide different aesthetics and functionalities. For example, by modifying one or more of the diameter of the holes 306, the depth of the holes 306 and/or the thickness of the metallic coating 308, the structure 300 may have different characteristics. In the illustrated example, the top and bottom surfaces of the structure 300 are relatively planar. However, if the holes 306 are deeper or wider, dimples or other concave features may appear on the surface. Such depressions may also result from decreasing the thickness of the coating.

In still other embodiments, the holes 306 may be provided on only one of the top surface 304a or the bottom surface 304b. In such embodiments, only the side having the holes may include the metallic coating. Accordingly, the top surface 304a or the bottom surface 304b of the core 302 may be exposed, while the other of the top surface 304a or the bottom surface 304b is coated. In still other embodiments, the coating may also be provided on the surface that has no holes.

FIG. 4 illustrates yet another embodiment of a composite structure 400 similar to the composite structure 300. Like the composite structure 300, the composite structure 400 includes a core 402, which may be a polymer core, a plurality of holes 406 formed in each of a top surface 404a and a bottom surface 404b of the core 402. Moreover, a metallic coating 408 is applied to both the top surface 404a and the bottom surface 404b.

Unlike the embodiment of FIG. 3, however, each of the holes 406 has a varied diameter. More specifically, the diameter of each of the holes 406 increases with the depth of the hole. The illustrated shape of the holes 406 may be the result of a wet etching process. Because of the profile of the holes 406, the metallic coating 408 may be more difficult to remove from the surface 404a, 404b of the core 402. More specifically, the metallic coating 408 filling the holes 406 will act as anchors or fasteners, because a diameter of the metallic coating 408 further away from the respective surface 404a, 404b in each of the holes 406 will be larger than a diameter of the hole at the surface 404a, 404b. The profile of the holes 406 may also be modified from the illustrated embodiment. For example, the diameter may increase linearly with respect to a depth of the hole. In still other embodiments, the profile may be stepped, similar to an embodiment described below with reference to FIG. 6. Of course, respective ones of the holes 406 may have different profiles.

Other modifications, including modifications described in connection with additional examples of this disclosure, may also be made to the structure 400. By way of non-limiting example, the density, depth, number, and arrangement of the holes 406 may be varied from the illustration. Also, only some of the holes 406 may have the illustrated profile, whereas others could have a constant diameter. Moreover, the depth of the holes could be such that the holes 406 extend through the core.

FIG. 5 illustrates yet another embodiment of a composite structure 500 according to this disclosure. Similar to previous embodiments, the structure 500 includes a core 502, which may be a polymer core, a plurality of holes 504 formed through the core 502, and a metallic coating 506 disposed on the core 502. In the illustrated embodiment, the holes 504 are formed as through holes, extending through the core 502. However, in this embodiment, a plug 508 is placed in the holes 504 prior to applying the metallic coating 506. The plug may be any material. In some embodiments, the plug may be made from a material that is lighter than the metallic coating and/or the core material, to lighten the overall weight of the structure 500. In some examples, the plug may be a foam, a polymer, a metal, or the like.

Figure 6:
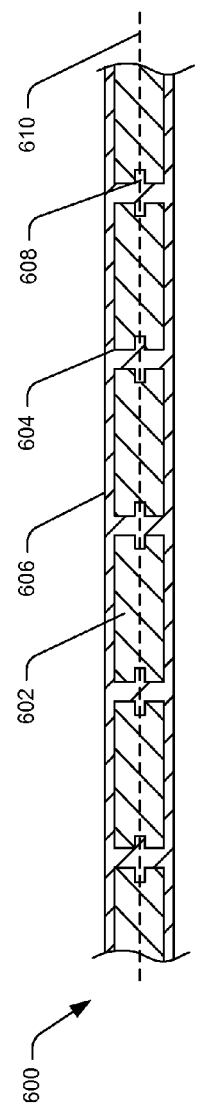
FIG. 6 illustrates still another example schematic cross-section of an alternative structure according to embodiments of this disclosure.

FIG. 6 illustrates another embodiment of a structure 600 that includes a core 602, a plurality of holes 604 formed as through holes through the core 602, and a metallic coating 606. Unlike previous embodiments, however, the holes 604 do not have a constant diameter. Instead, the holes 604 include a stepped diameter that creates a void 608 inside the core 602. The metallic coating also fills the void 608, which may provide additional strength and/or resistance to delamination.

The voids 608 may be formed in the core 602 using known techniques. For example, the core 602 may be fabricated as two parts, e.g., a first part above line 610 and a second part below line 610, for subsequent joining along line 610. In similar implementations, instead of a stepped profile as illustrated, the holes may instead have a conical-shaped profile, mushroom-shaped profile, or the like, i.e., that has a larger diameter further from the surface.

Figure 7:
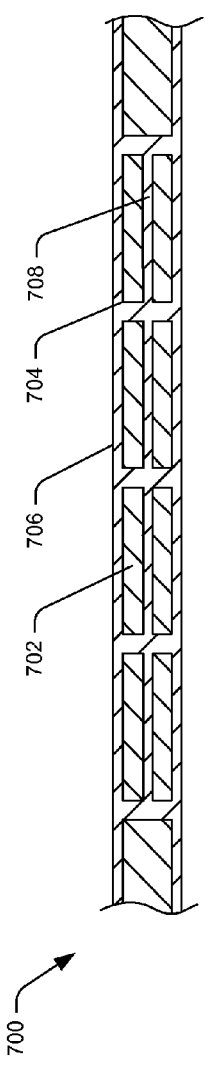
FIG. 7 illustrates still another example schematic cross-section of an alternative structure according to embodiments of this disclosure.

FIG. 7 illustrates another example structure 700. The structure 700 includes a core 702, plurality of holes 704 formed through the core 702, and a metallic coating 706 applied to the core 702. Similar to the embodiment of FIG. 6, the structure 700 includes a void 708 formed inside the core 702. In this example, the void 708 may exist because the core 702 is hollow. In the illustration, the metallic coating 706 completely fills the void 708. However, in alternative implementations, and depending upon the method of applying the metallic coating, the void 708 may remain substantially unfilled by the metallic coating 706. For example, the coating may only extend laterally within the void a small distance relative to a distance between adjacent holes of the plurality of holes 704. Implementations as the one illustrated in which the metallic coating substantially fills the void may provide further rigidity and strength. Alternatively, embodiments in which the metallic coating 706 does not fill the void 708 completely may provide a lighter-weight alternative to some previously-described embodiments.

Figure 8:
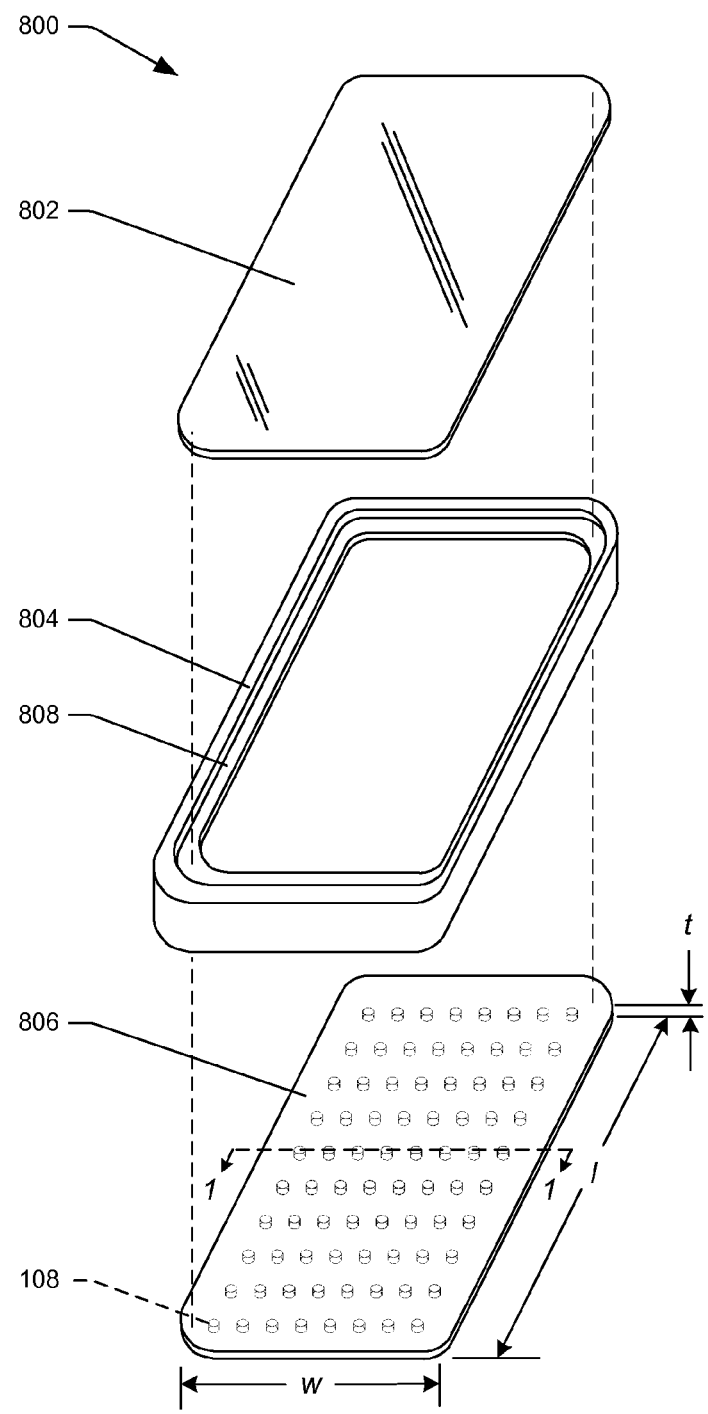
FIG. 8 is an exploded perspective view of an example electronic device that includes a back cover made of the structure illustrated in one or more of FIGS. 1A-7.

The foregoing structures 100, 200, 300, 400, 500, 600, 700 may be used in any number of applications, including applications where a lightweight, structurally rigid structure is desirable. One example implementation is in an electronic device. FIG. 8 shows a housing 800 of an electronic device, which is one implementation for a structure according to this disclosure.

In FIG. 8, the housing 800 generally includes a peripheral frame 802, a front cover 804 and a back cover 806. When assembled, the housing 800 defines a cavity in which components, such as a display stack, antennae, electronics, and the like, are housed. In the illustration, the front cover 804 rests on a front bezel 808 provided on the peripheral frame 802. When the front cover is seated on the front bezel 808, edges of the front cover 804 may be surrounded entirely by the peripheral frame 802. Although not illustrated, the peripheral frame 802 may also include a rear bezel, upon which the back cover 806 rests.

The peripheral frame 802 may be a polymer or a foam, and the front cover 804 may be glass or transparent plastic, to allow for viewing of a content item on a display disposed behind the front cover 804. In still other embodiments, the front cover 804 may comprise one or more components of a display.

In FIG. 8, the back cover 806 is formed of the composite structure 100, 200, 300, 400, 500, 600, 700. As illustrated, the back cover 806 is formed as a substantially planar structure, having a thickness t, a length l normal to the thickness t, and a width w normal to both the thickness t and the length l. The holes 108 described above with reference to FIGS. 1A-1C are illustrated in hidden lines in FIG. 8. The cross-sectional diagrams of FIGS. 1A-1C (and of the subsequent FIGS. 2-7) may be taken along the section line 1-1 in FIG. 8.

As illustrated in FIG. 8, the holes 108 are arranged in a two-dimensional array, spaced along the length and width. In the illustrated embodiment, the holes are spaced equidistantly along the length and along the width. In other embodiments, however, the spacing of the holes may vary. For example, spacing the holes relatively closer, i.e., to increase the hole density, may provide improved rigidity and strength, which could be desirable closer to the periphery of the back cover 806, near bends and/or corners, and/or near points of potential bending. Similarly, there may be areas of the back cover 806 in which the holes can be spaced a greater distance from each other, e.g., because there is less of a need for additional strength and/or rigidity. For example, when the structure is used as the back cover 806, areas central to the cover, i.e., spaced from the periphery may have a lower hole density, or may have no holes. As will be appreciated, inasmuch as the metallic coating is heavier than the polymer core, as the number of holes increases, the weight of the back cover will increase as more metal will be used. The size, density, number and size of holes may vary based on design criteria, including weight constraints, flexure requirements, and the like.

In the embodiment of FIG. 8, the structure 100, 200, 300, 400, 500, 600, 700 is used as a back cover. Although not illustrated, components making up the electronic device may be mounted or otherwise supported on the surface of the back cover closest to the front cover. Other implementations of the structures described herein also are contemplated. For example, a member formed using the structure may be disposed in the housing 800, e.g., as a mid-plate between the front cover 804 and the back cover 806. So-situated, the structure may comprise a portion of the frame and/or act as a support member upon which other components are supported.

Figure 9:
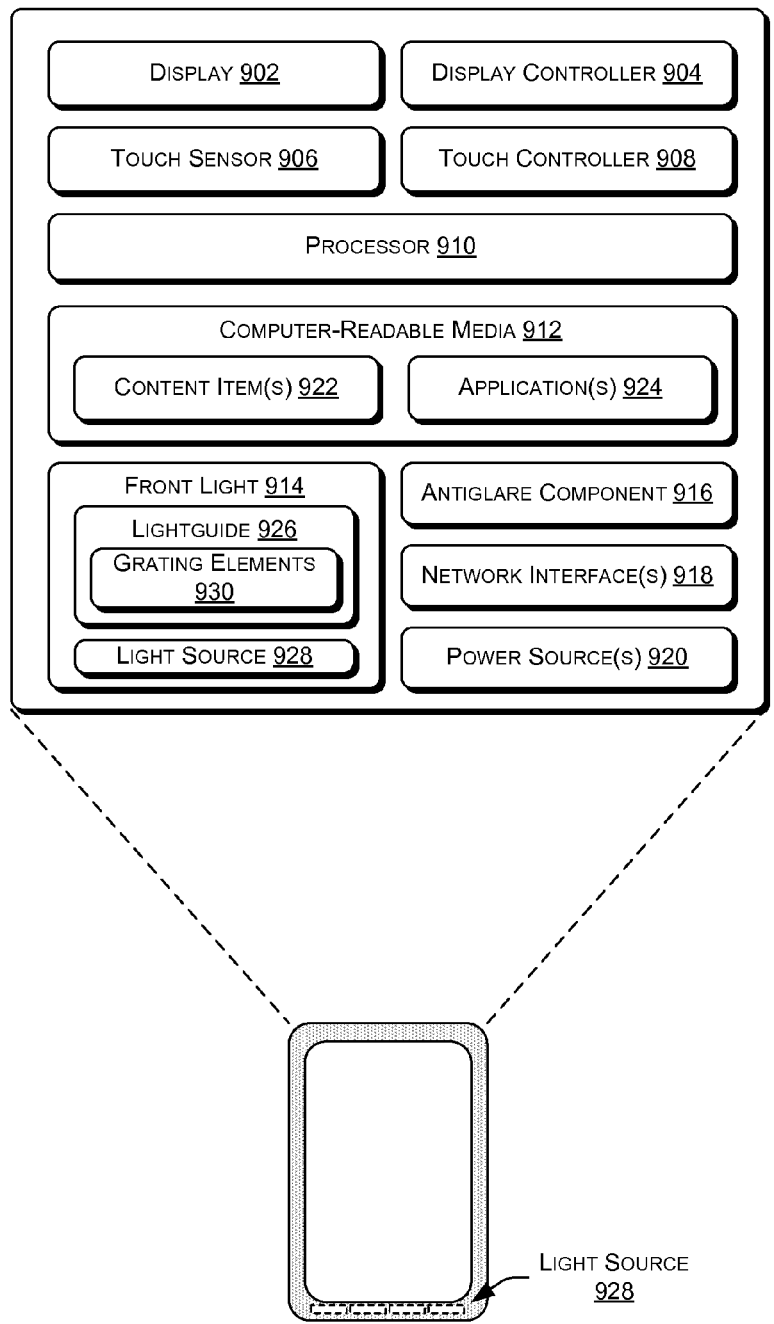
FIG. 9 is a schematic representation of components of an example electronic device.

FIG. 9 illustrates an example electronic device 900, which may incorporate the housing 800. The device 900 may comprise any type of mobile electronic device (e.g., an electronic book reader, a tablet computing device, a laptop computer, a multifunction communication device, a portable digital assistant (PDA), etc.). In addition, while FIG. 9 illustrates several example components of the electronic device 900, it is to be appreciated that the device 900 may also include other conventional components, such as an operating system, system busses, input/output components, and the like. In other embodiments, the electronic device 900 may not include all of the components illustrated in FIG. 9.

Regardless of the specific implementation of the electronic device 900, the device 900 includes a display 902 and a corresponding display controller 904. In example embodiments, the device 900 may also include one or more of a touch sensor 906, a touch controller 908, a processor 99, a computer-readable media 912, a front light 914, antiglare components 916, network interfaces 918, and one or more power sources 920. In some embodiments, the computer-readable media 912 may include one or more content items 922 and/or applications 924. Additionally, in some embodiments the front light 914 may include a light guide 926, a light source 928, and/or one or more grating elements 930.

Other uses for the structures described herein will be appreciated by those having ordinary skill in the art with the benefit of this disclosure. For example, the composite structures described herein may be used in electronic devices that are not hand-held or that do not include a display. The structure may also be used in myriad non-electronic device applications, including any application in which strength, rigidity, weight, and/or aesthetics are of interest.

Figure 10:
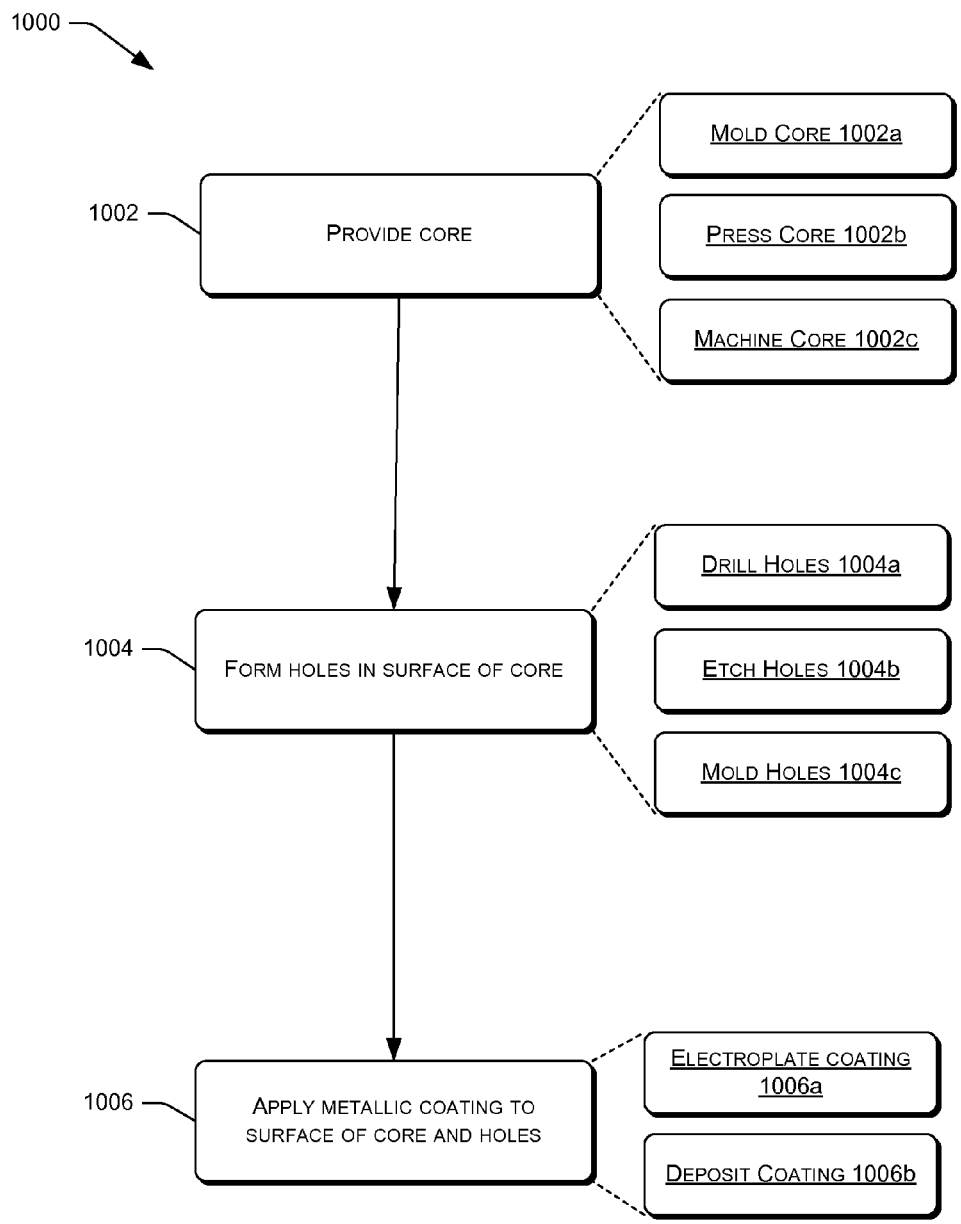
FIG. 10 is a flow diagram illustrating an example method of manufacturing a structure according to embodiments of this disclosure.

FIG. 10 illustrates an example method 1000 of manufacturing one or more of the structures 100, 200, 300, 400, 500, 600, and/or 700 described above. The order in which the operations are described is not intended to be construed as a limitation, and any number of the described operations can be combined in any order and/or in parallel to implement the process.

The method 1000 includes, at 1002, providing a core. In some embodiments, the core may be a polymer core, such as a thermopolymer. The core may be formed using molding techniques at 1002a, including injection molding, blow molding, compression molding, or the like. In other embodiments, the core may be thermoformed, such as by pressing at 1002b, or it may be machined from a block or slug of material such as at 1002c. The core may alternatively be formed via extrusion. In still further embodiments, the core may be made using a three-dimensional printing. In some examples, the core is made of ABS or polycarbonate.

At 1004, the holes are formed in the surface of the core. As noted above, in some embodiments, the holes are through-holes, whereas in other embodiments the holes are blind, i.e., non-through-holes, and may be formed on more than one surface of the core. In some embodiments, the holes are formed via a mechanical process, such as drilling at 1004a, a water jet, an air jet, a punch, or the like. A laser may also be used to form the holes. In still other embodiments, the holes may be etched into the core, such as at 1004b, for example, using conventional dry etching (e.g., reactive-ion etching) or wet etching techniques. In still other embodiments, the holes may be formed as part of the formation of the core. For example, as illustrated at 1004c, the holes may result from molding the core, such as at 1004c.

At 1006, the metallic coating is applied to the core. In embodiments of this disclosure, the plating is applied on inner surfaces of the holes and at least one of outer surface of the core. Examples of the locations and extent of the coating are illustrated in the embodiments discussed above. The coating may be applied at any thickness. For example, a thickness of the coatings may vary depending upon the application technique, design specifications, and/or other criteria. In some embodiments the thickness of the coating may vary from about 10 microns to about 30 microns. As will be appreciated, when the coating is applied to the inner surface of the holes, depending upon the diameter of the holes and the thickness of the coating, the coating may entirely fill the holes, or holes may remain after the coating. In some embodiments, the metallic coating may have a substantially uniform thickness but in some examples the thickness may be non-uniform. Whether the coating is uniform may depend upon design choice and/or the method of applying the coating (e.g., some application methods may be better suited to coat the inner surface of the holes).

In some embodiments, the core may be immersed in a bath to electroplate the core, as at 1006a. In other embodiments, the coating may be applied via a deposition process, as at 1006b. The deposition process may include sputtering, CBD, or PVD, for example. In still other embodiments, the metallic coating may be chemically applied.

Although not illustrated, prior to applying the metallic coating, the core may be prepared to receive the metallic coating. For example, exposed surfaces of the core may be abraded to provide an increased surface area that may better promote retention of the metallic coating on the core. In other examples, when the coating is applied via electroplating, a seed layer may be applied to the core and inner surfaces of the holes, as in conventional electroplating processes.

In some embodiments, step 1006 may be repeated, for example, to apply multiple coatings. Also, in some embodiments processes may be carried out after applying the coating at 1006. For instance, paint or another covering, whether or not metallic, may be applied to the metallic coating.

The method 1000 may alternatively including inserting plugs, such as plugs 508 into holes formed in the core. The plugs may be a relatively lightweight material, such as a foam, or could be epoxy, or even paint. Moreover, plugs may be applied to holes remaining in the structure after the metallic coating is applied.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

The invention claimed is:

1. A housing for an electronic device comprising:
   a display to present a content item;
   a front cover via which the content item is viewable; and
   a back cover opposite the front cover, the back cover comprising:
   a polymer core having a thickness between a first surface and a second surface opposite the first surface;
   a plurality of holes extending from the first surface to the second surface, the plurality of holes being arranged in an array; and
   a metallic coating on the first surface of the polymer core, the second surface of the polymer core, and an inner surface of each of the plurality of holes, the metallic coating extending continuously from the first surface through the plurality of holes to the second surface to mechanically connect the first surface and the second surface.

2. The housing of claim 1, wherein the metallic coating fills each of the plurality of holes to create a continuous metallic coating on each of the first surface and the second surface.

3. The housing of claim 1, wherein the metallic coating on the inner surface of each of the plurality of holes covers the inner surface and has a thickness less than a radius of the respective hole to provide a coated through hole extending from the first surface to the second surface at the respective hole.

4. The housing of claim 1, wherein a distance between a first hole of the plurality of holes and a second hole adjacent to the first hole is different than a distance between the first hole and a third hole adjacent to the first hole.

5. A composite structure comprising:
   a polymer core comprising a top surface and a bottom surface and having a plurality of holes extending through the polymer core from the top surface to the bottom surface; and
   a metallic coating on the polymer core and on an internal surface of each of the plurality of holes, the metallic coating on the internal surface extending across the diameter of each of the plurality of holes to occlude each of the plurality of holes, the metallic coating on the polymer core extending along at least one of the top surface or the bottom surface to connect the metallic coating on the internal surface of adjacent holes of the plurality of holes, and the metallic coating being free of a polymer.

6. The composite structure of claim 5, wherein each of the plurality of holes has a diameter of from about 10 microns to about 100 microns.

7. The composite structure of claim 5, wherein the metallic coating comprises nickel, cobalt, copper, chromium, titanium, tin, gold, silver, palladium or platinum.

8. The composite structure of claim 5, wherein a thickness of the core is from about 600 microns to about 1000 microns and a diameter of each of the plurality of holes is from about 10 microns to about 100 microns.

9. The composite structure of claim 8, wherein a thickness of the metallic coating is from about 10 to about 25 microns.

10. The composite structure of claim 5, wherein each of the plurality of holes is formed in a surface of the polymer core and the inner surface of each of the plurality of holes has a profile such that a diameter of the hole further from the surface of the polymer core is larger than a diameter of the hole at the surface of the polymer core.

11. The composite structure of claim 5, further comprising a plug disposed in at least one of the plurality of holes.

12. A method of manufacturing a structure comprising:
   providing a polymer core having a first surface and an opposite second surface;
   forming a plurality of holes in the first surface or the second surface; and applying a metallic coating that is free of a polymer on at least one of the first surface or the second surface and on an internal surface of each of the plurality of holes, the metallic coating on the internal surface of each of the plurality of holes having a thickness that completely occludes the respective hole and the metallic coating on the at least one of the first surface or the second surface extending between the metallic coating on the internal surface of adjacent holes of the plurality of holes to connect the metallic coating on the internal surface of the adjacent holes.

13. The method of claim 12, wherein the applying the metallic coating comprises electroplating the polymer core or depositing the metallic coating.

14. The method of claim 12, wherein forming the plurality of holes comprises forming a plurality of through-holes extending from the first surface to the second surface and wherein the metallic coating comprises a continuous coating extending from the first surface to the second surface via the plurality of through-holes.

15. The method of claim 12, wherein the polymer core comprises acrylonitrile butadiene styrene or polycarbonate.

16. The method of claim 12, wherein the metallic coating comprises nickel, cobalt, copper, chromium, titanium, tin, gold, silver, palladium or platinum.

17. A composite structure comprising:
a polymer core having a thickness between a first surface and a second surface;
a plurality of holes formed in at least one of the first surface or the second surface of the polymer core; and
a metallic coating on the polymer core and on an internal surface of each of the plurality of holes,
wherein the plurality of holes are formed in an array and the array of the plurality of holes comprises a first density of holes in a first location and a second density of holes in a second location, wherein the first location is closer in proximity to a lateral edge of the polymer core than the second location and the first density is higher than the second density.

18. The composite structure of claim 17, wherein the metallic coating on the internal surface of each of the plurality of holes has a thickness that is less than a radius of the respective one of the plurality of holes.

19. The composite structure of claim 17, wherein each of the plurality of holes extends a depth into the polymer core and the depth is less than the thickness.

20. The composite structure of claim 17, wherein the inner surface of each of the plurality of holes has a profile such that a diameter of the hole at a position spaced from the surface of the polymer core is larger than a diameter of the hole at the surface of the polymer core.

* * * * *